US008685260B2

(12) United States Patent
Stone

(10) Patent No.: US 8,685,260 B2
(45) Date of Patent: *Apr. 1, 2014

(54) CONDUCTIVE POLYMER ELECTRODES

(75) Inventor: Kate Jessie Stone, Cambridge (GB)

(73) Assignee: Novalia Ltd., Cambridge (GB)

( * ) Notice: Subject to any disclaimer, the term of this patent is extended or adjusted under 35 U.S.C. 154(b) by 1291 days.

This patent is subject to a terminal disclaimer.

(21) Appl. No.: 12/296,803

(22) PCT Filed: Apr. 11, 2007

(86) PCT No.: PCT/GB2007/001341
§ 371 (c)(1),
(2), (4) Date: Oct. 10, 2008

(87) PCT Pub. No.: WO2007/129001
PCT Pub. Date: Nov. 15, 2007

(65) Prior Publication Data
US 2009/0124090 A1 May 14, 2009

(30) Foreign Application Priority Data

Apr. 11, 2006 (GB) .................................. 0607208.6

(51) Int. Cl.
H01B 13/00 (2006.01)
B44C 1/22 (2006.01)

(52) U.S. Cl.
USPC ................. 216/13; 216/83; 216/96; 216/100; 438/745; 427/58; 427/68; 427/74

(58) Field of Classification Search
USPC ........... 216/13, 83, 96, 100; 438/745; 427/58, 427/68, 74
See application file for complete search history.

(56) References Cited

U.S. PATENT DOCUMENTS 5,064,091 A 11/1991 Gerhard
6,051,116 A 4/2000 Ichinose (Continued)

FOREIGN PATENT DOCUMENTS

DE 10 2004 031 719 A1 1/2006
EP 1 383 179 1/2004

(Continued)

OTHER PUBLICATIONS

International Search Report for PCT/GB07/001341 published Nov. 15, 2007.
Written Opinion for PCT/GB07/001341 published Oct. 11, 2008.
International Preliminary Report on Patentability for PCT/GB07/001341 published Oct. 14, 2008.

(Continued)

Primary Examiner — Shamim Ahmed
(74) Attorney, Agent, or Firm — Fleit Gibbons Gutman Bongini & Bianco PL; Paul D. Bianco; Gary S. Winer

(57) ABSTRACT

A known method of forming organic semiconductor devices employs the deposition of a conductive polymer onto a substrate to form electrodes or conductive tracks and then to apply an electrical material such as an organic semiconductor on top of these tracks. Although the conductive polymer serves as a highly efficient injector of electrons into the semiconductor, it is not a good conductor. This introduces undesirable inefficient in the supply of current to and from the semiconductor. Worse still the conductivity may deteriorate with time. A solution to this problem has been found by printing the polymer (7) onto a conductive layer (6) carried on a substrate (5). The printed polymer (7) is then used as a resist during a process in which parts of the conductive polymer not protected by the polymer are removed. The resulting device benefits from the good electron injection qualities of the conductive polymer (7) and efficient conduction by virtue of the underlying conductive layer (6).

19 Claims, 1 Drawing Sheet

(56) References Cited

U.S. PATENT DOCUMENTS

| | | | |
|---|---|---|---|
| 6,596,183 B2* | 7/2003 | Chen | 216/4 |
| 6,866,799 B2* | 3/2005 | Orsbon et al. | 252/511 |
| 6,992,324 B2 | 1/2006 | Nagayama | |
| 7,038,237 B2 | 5/2006 | Nagayama | |
| 2002/0106458 A1* | 8/2002 | Montano et al. | 427/410 |
| 2003/0035917 A1 | 2/2003 | Hyman | |
| 2004/0012017 A1 | 1/2004 | Nagayama | |
| 2004/0127065 A1 | 7/2004 | Cho et al. | |
| 2004/0149683 A1* | 8/2004 | Baek et al. | 216/23 |
| 2004/0175550 A1* | 9/2004 | Lawrence et al. | 428/209 |
| 2005/0064091 A1 | 3/2005 | Shunpei | |
| 2005/0089791 A1 | 4/2005 | Touwslager | |
| 2005/0186700 A1 | 8/2005 | Klauk | |
| 2006/0022194 A1 | 2/2006 | Nagayama | |
| 2006/0160266 A1 | 7/2006 | Bernds | |
| 2006/0238690 A1* | 10/2006 | Angelopoulos et al. | 349/143 |
| 2007/0221610 A1* | 9/2007 | Chow et al. | 216/13 |
| 2009/0275167 A1 | 11/2009 | Stone | |

FOREIGN PATENT DOCUMENTS

| | | |
|---|---|---|
| EP | 1 638 155 | 9/2004 |
| JP | 2004 268319 | 9/2004 |
| WO | 01/20691 | 3/2001 |
| WO | WO 03/067333 | 8/2003 |
| WO | WO 2004/066348 | 8/2004 |

OTHER PUBLICATIONS

For U.S. Appl. No. 12/296,772: Office Actions dated May 27, 2010, Aug. 3, 2010, May 16, 2011, Aug. 31, 2011, Jun. 13, 2012 Reponses dated Jun. 24, 2010, Feb. 3, 2011, Jun. 14, 2011, Nov 30, 0211.
International Search Report published Nov. 15, 2007 for PCT/GB07/1337.
Written Opinion published Oct. 11, 2008 for PCT/GB07/1337.
International Prelim Report on Patentatibiliy published Oct. 14, 2008 for PCT/GB07/1337.
Machine tranlsation of JP2004-268319 translated Jan. 28, 2011.
For U.S. Appl. No. 12/296,772: Advisory Action dated Oct. 23, 2012; Response filed Oct. 12, 2012.

\* cited by examiner

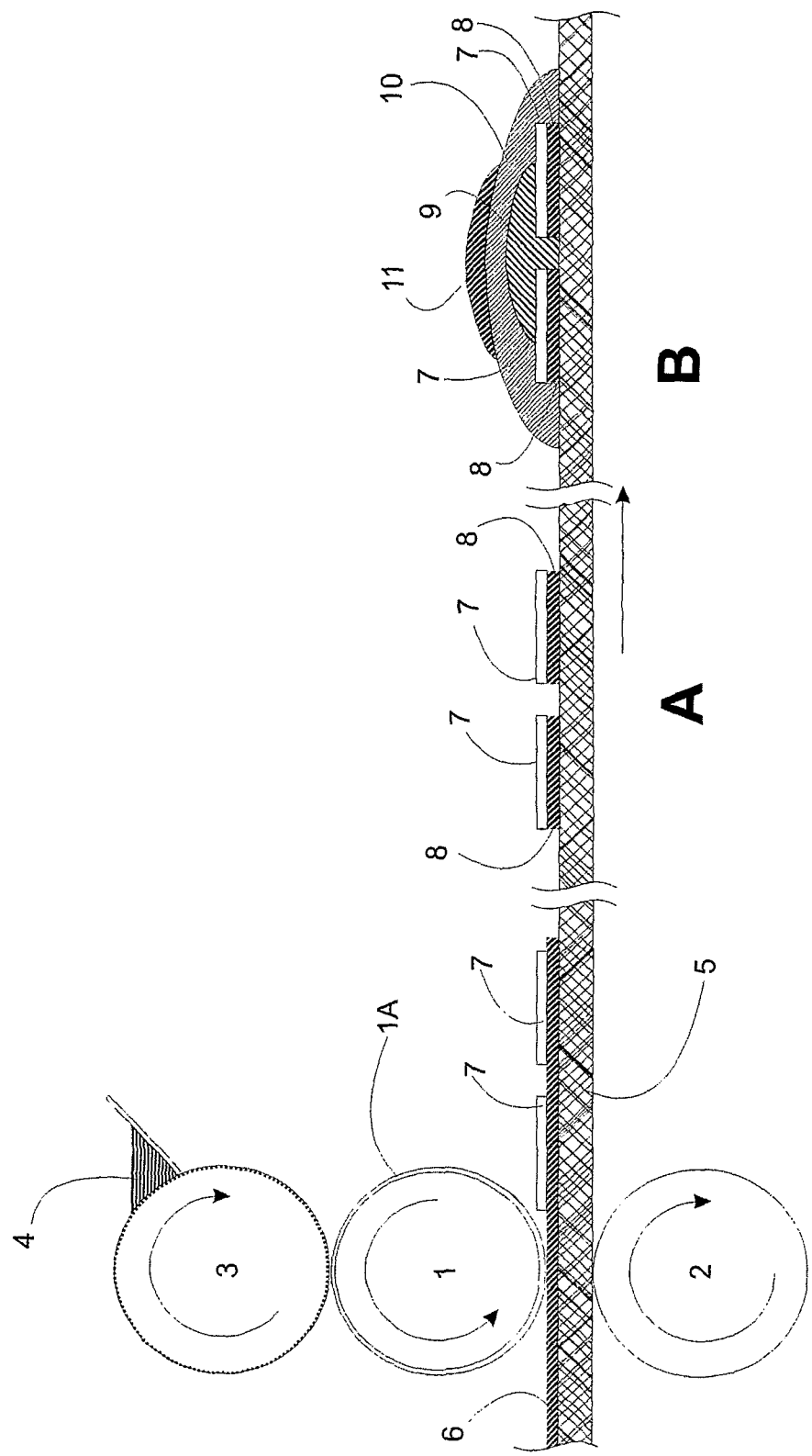

CONDUCTIVE POLYMER ELECTRODES

FIELD OF THE INVENTION

This invention relates to a method of making an electrical device in which a conductive polymer is deposited onto a substrate to form electrodes or conductive tracks and an electrical material, such as an organic semiconductor, is applied over the top of these tracks.

BACKGROUND OF THE INVENTION

Organic semiconductor devices manufactured in this way are known, an example being described in patent specification WO 01/20691. In such devices, the conductive polymer from which the electrodes are formed, serves as a highly efficient injector of electrons into the semiconductor. However, the conductive polymer is unfortunately not a very good electrical conductor. This introduces undesirable inefficiencies in the supply of current to and from the semiconductor. Worse still, the conductivity can deteriorate with time.

SUMMARY OF THE INVENTION

This invention aims to overcome the above-mentioned problem.

The invention provides a method of making an electrical device in which a conductive polymer is applied onto a substrate to form electrodes or conductive tracks characterised in that the substrate carries a conductive layer onto which the polymer is printed and in that the printed polymer is then used as a resist during a process in which parts of the conductive layer not protected by the polymer are removed.

By employing the invention it becomes possible to benefit from the good electron injection qualities of the conductive polymer whilst providing efficient conduction of current by virtue of the underlying conductive layer, which can be metal. Furthermore, because the conductive polymer is used as a resist, accurate registration of the patterns of the polymer and of the underlying conductor is automatically achieved.

The aforementioned electrical material is preferably a semiconductor material in, for example, a diode, light emitting diode or a transistor. However, the invention may find uses in other fields such as voltaic cells or batteries, solar cells, electro chromic displays and sensors of various forms.

The conductive polymer is preferably a salt of a poly (3, 4-substituted thiophene) and can be made by mixing polyethylenedioxythiaphene (PEDOT) with polystyrene sulphanate.

The underlying conductive layer is preferably metallic. A particularly suitable metal is aluminium because this is highly conductive and can inexpensively be deposited from a vapour onto thin synthetic plastic sheet. However other metals such as gold would be suitable and the higher cost of this could be acceptable for some purposes. The surface of the metal may benefit from treatment eg by corona discharge to improve its adhesion to the conductive polymer.

The removal of the unwanted parts of the normally metallic conductive layer is preferably effected by chemical etching. For some metals, particularly aluminium, this is best performed using an alkali such as sodium hydroxide solution. This may have a detrimental effect on the properties of the conductive polymer and for that reason it may be desirable to "refresh" the polymer by application of an acid.

The pattern of polymer is preferably formed by a printing process, such as flexographic printing, in which a solution of the polymer is applied so as to adhere only to selected areas. Printing in that way can be both fast and economical and material is not wasted.

BRIEF DESCRIPTION OF THE DRAWINGS

One way of employing the invention will now be described by way of example with reference to the accompanying drawing which is a very schematic diagram showing the manufacture of semiconductor devices using a process in accordance with the invention.

DETAILED DESCRIPTION OF THE INVENTION

Referring to the drawing there is shown a flexographic printing apparatus comprising a main roller 1 around which is wrapped a polymer sheet 1A defining, in relief, an image of the required pattern of electrodes in the finished product. This image is formed using methods that are well known in the field of flexographic printing. The main roller co-operates with an idler roller 2 and an anilox roller 3 which is used to apply a measured amount of a solution 4 to the roller 1.

The solution 4 is an aqueous solution of PEDOT PSS consisting of a mixture of polyethylenedioxythiaphene and polystyrene sulphanate. It is readily available under the trade names BAYTRON and HCSTARK (BAYTRON is a registered trade mark of Bayer Aktiengesellschaft).

A thin web 5 (the thickness of which is shown greatly exaggerated in the drawing) is formed from inexpensive synthetic plastics material carrying a vapour deposited layer 6 of aluminium. This metal layer is about 30 to 40 nm thick and has a smooth surface which has been treated by corona discharge to help adhesion of the PEDOT. The metalised web is fed through a nip formed between the rollers 1 and 2 causing a pattern of the solution to be printed onto the aluminium 6. When the solvent (in this case water) has evaporated, the web is immersed in an aqueous solution of sodium hydroxide. The PEDOT pattern acts as a resist allowing the sodium hydroxide to etch away the aluminium from areas not protected by it. The result is a pattern of electrodes as shown at A on FIG. 1 with each electrode having an upper layer 7 of PEDOT and a lower layer 8 of metal.

The electrodes might typically have a track width of between 2 and 50 microns and a separation of between 5 and 20 microns. Although only one pair of such electrodes is illustrated, these being destined to form the source and drain electrodes of a transistor, it will be appreciated that the web will be formed with a very large number of such formations which may either be similar or different. They may be electrically separate or linked to form a complex circuit depending on the purpose of the product.

Referring to position B on the drawing, a solution of organic semiconductor is printed so as to form a patch 9 about 100 nm thick on top of the smooth surface of each pair of electrodes and in the channel between them. This printing operation is performed at a low temperature, below 100° C., which is harmless to the underlying web 5. After application of the semiconductor material, a layer 10, about 500 nm thick, of a dielectric is applied and finally a conductive gate 11 to form the finished transistor.

The invention claimed is:
1. A method of making an electrical device comprising:
   printing a conductive polymer onto a substrate coated with a conductive layer to form a pattern for electrodes or conductive tracks;

removing unprinted portions of the conductive layer, the printed conductive polymer acting as a resist to the printed portions of the conductive layer; and applying an electrical material over the top of the printed conductive polymer resist.

2. A method according to claim 1 wherein the electrical material is a semiconductor material.

3. A method according to claim 2 wherein the electrical device is a diode, light emitting diode or transistor.

4. A method according to claim 1 wherein the electrical device is a voltaic cell or battery.

5. A method according to claim 1 wherein the electrical device is a solar cell.

6. A method according to claim 1 wherein the electrical device is an electro chromic display.

7. A method according to claim 1 wherein the electrical device is a sensor.

8. A method according to claim 1 wherein the conductive layer is metallic.

9. A method according to claim 8 wherein the surface of the metal is treated so as to improve cohesion with the conductive polymer.

10. A method according to claim 1 wherein the said portions of the printed conductive layer are removed using an alkali etchant and in that the printed conductive polymer is then treated with an acid to correct for any detrimental effect of the alkali on its electrical properties.

11. A method of producing an electrical device comprising:
printing a pattern of conductive polymer to form electrode or conductive tracks over a conductive layer coating a substrate, the conductive polymer able to donate electrons in an electrical circuit;
chemically etching the printed substrate to remove the conductive layer not over printed by conductive polymer, the conductive polymer acting as a resist;
chemically refreshing the conductive polymer to restore an electron donating ability of the conductive polymer lost during the chemical etching;
applying a semiconductor material over printed portions of the conductive polymer, acting as a resist, and the etched over printed conductive layer.

12. The method of claim 11, wherein the conductive substrate is a metallic layer.

13. The method of claim 11, further comprising treating the surface of the conductive layer so as to improve cohesion with the conductive polymer.

14. The method of claim 11, the semiconductor material covering a pair of electrodes formed by the chemical etching.

15. The method of claim 11, wherein the chemical etching is performed using an alkali material, and the refresh is performed using an acid.

16. The method of claim 11, wherein the electrical device is selected from the group consisting of diode, light emitting diode, and transistor.

17. The method of claim 11, wherein the electrical device is selected from the group consisting of voltaic cell, battery, solar cell, electro chromic display, and sensor.

18. The method of claim 11, wherein the conductive polymer is printed in a pattern using a flexographic printing process.

19. A method of producing an electrical device comprising:
printing a pattern of conductive polymer using a flexographic printing process to form electrode or conductive tracks over a conductive layer coating a substrate, the conductive polymer able to donate electrons in an electrical circuit;
chemically etching the printed substrate to remove the conductive layer not over printed by conductive polymer, the printed pattern of conductive polymer remaining on the conductive layer and acting as a resist;
chemically refreshing the conductive polymer to restore an electron donating ability of the conductive polymer lost during the chemical etching;
applying a semiconductor material over the printed pattern of conductive polymer acting as a resist.

\* \* \* \* \*